United States Patent [19]
Nomura

[11] Patent Number: 6,100,727
[45] Date of Patent: Aug. 8, 2000

[54] NOISE-IMMUNE DYNAMIC DRIVING CIRCUIT CAPABLE OF SUPPRESSING GENERATION OF A FEEDTHROUGH CURRENT AND INCREASE OF A DELAY

[75] Inventor: Masahiro Nomura, Tokyo, Japan

[73] Assignee: NEC Corporation, Tokyo, Japan

[21] Appl. No.: 09/243,755

[22] Filed: Feb. 3, 1999

[30] Foreign Application Priority Data

Feb. 3, 1998 [JP] Japan .................................. 10-021832

[51] Int. Cl.$^7$ ....................................................... H03K 3/00
[52] U.S. Cl. ............................................ 327/108; 327/112
[58] Field of Search ................................. 327/108, 112, 327/291, 292, 298, 389, 391, 427, 434, 437; 326/81–85, 27, 28

[56] References Cited

U.S. PATENT DOCUMENTS

| | | | |
|---|---|---|---|
| 5,111,064 | 5/1992 | Ward | 327/108 |
| 5,306,965 | 4/1994 | Asprey | 327/108 |
| 5,410,262 | 4/1995 | Kang | 327/108 |
| 5,617,043 | 4/1997 | Han et al. | 326/83 |
| 5,786,720 | 7/1998 | Nguyen et al. | 327/321 |

FOREIGN PATENT DOCUMENTS

| | | |
|---|---|---|
| 63-195898 | 8/1988 | Japan . |
| 1-161913 | 2/1989 | Japan . |
| 1-175412 | 7/1989 | Japan . |
| 2-124629 | 5/1990 | Japan . |
| 4-49407 | 2/1992 | Japan . |

OTHER PUBLICATIONS

Weste, Neil H.E. and Kamran Eshraghian, "Principles of CMOS VLSI Design—A Systems Perspective–Second Edition", published in 1993, p. 308.

*Primary Examiner*—My-Trang Nuton
*Attorney, Agent, or Firm*—Ostrolenk, Faber, Gerb & Soffen, LLP

[57] ABSTRACT

In a dynamic driving circuit 100 supplied with a clock signal 131 having high and low levels determining a precharge period and an evaluation period, respectively, and supplied with a data signal 132 a control unit 101 is supplied with the clock signal and the data signal for producing a high-level control signal and a low-level control signal. A high-level driving unit 111 produces, in response to the high-level control signal received from the control unit, an output signal which drives a signal line 141 into a high level. A low-level driving unit 121 produces, in response to the low-level control signal received from the control unit, another output signal which drives the signal line into a low level. The control unit produces the high-level control signal so that the output signal of the high-level driving unit has a high level in the precharge period irrespective of the data signal and that the output signal of the high-level driving unit has the high level only when the data signal has a high level in the evaluation period. The control unit produces the low-level control signal so that the output signal of the low-level driving unit has a low level only when the data signal has a low level in the evaluation period.

11 Claims, 10 Drawing Sheets

NOISE-IMMUNE DYNAMIC DRIVING CIRCUIT CAPABLE OF SUPPRESSING GENERATION OF A FEEDTHROUGH CURRENT AND INCREASE OF A DELAY

BACKGROUND OF THE INVENTION

This invention relates to a dynamic driving (or driver) circuit and, in particular, to a dynamic driving circuit for driving a signal line of an integrated circuit.

Traditionally, in a dynamic driving operation of a signal line in an integrated circuit, a high level at a dynamic node is achieved by holding electric charges. However, maintaining the high level by holding the electric charges makes the device susceptible to the influence of charge leakage or a noise. This possibly results in malfunction of the integrated circuit. In view of the above, use has been made of a dynamic driving circuit in order to improve data holding characteristics. For example, dynamic driving circuits of the type are disclosed in Japanese Unexamined Patent Publication (JP-A) No. 4-49407 (49407/1992) and "Principles of CMOS VLSI Design—A Systems Perspective—Second Edition" written by Neil H. E. Weste and Kamran Eshraghian, published in 1993, page 308, FIG. 5.36.

Two other dynamic driving circuits of the type will hereunder be described as first and second conventional dynamic driving circuits.

Figure 1:
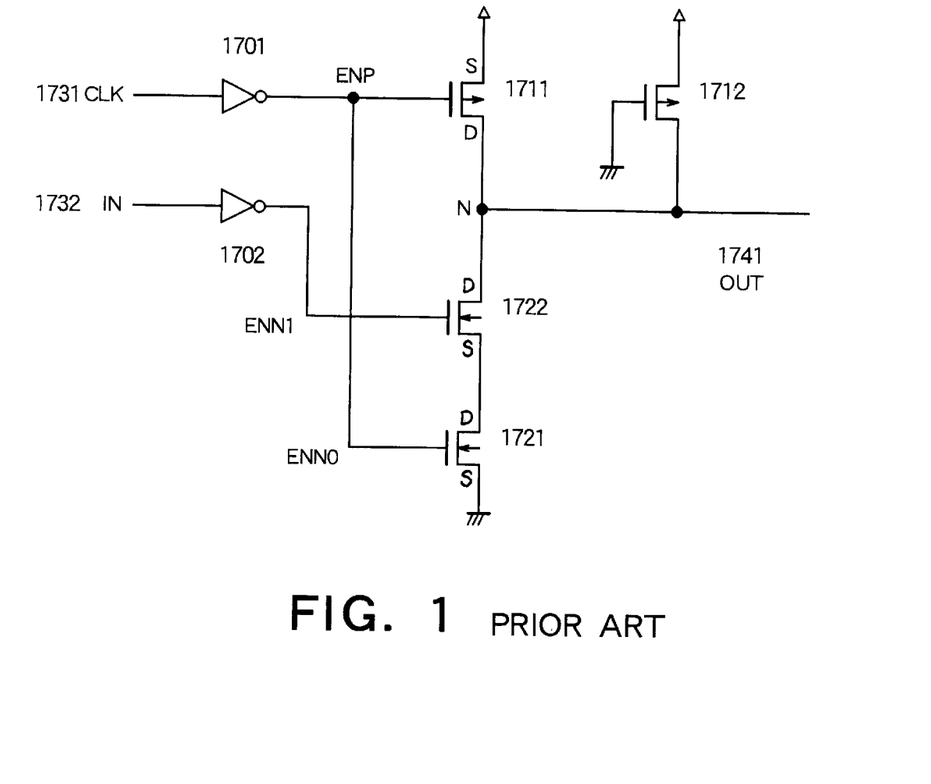
FIG. 1 is a circuit diagram of a first conventional dynamic driving circuit.
Figure 2:
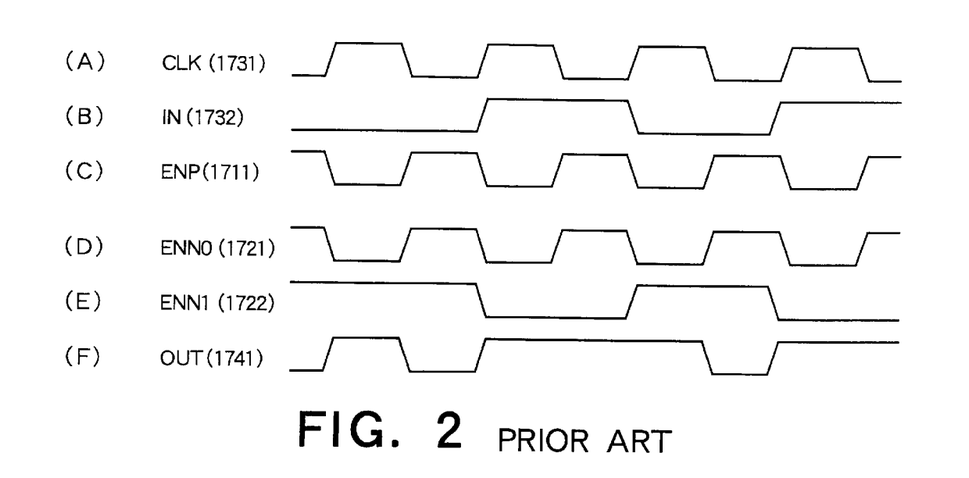
FIG. 2 shows waveforms of various signals in the circuit illustrated in FIG. 1.

Referring to FIGS. 1 and 2, the first conventional dynamic driving circuit will be described.

As illustrated in FIG. 1, the first conventional dynamic driving circuit comprises first and second inverter circuits 1701 and 1702, first and second pMOS (p channel metal oxide semiconductor) transistors 1711 and 1712, and first and second nMOS (n channel metal oxide semiconductor) transistors 1721 and 1722. A clock signal (CLK) 1731 is inverted by the first inverter circuit 1701 to be supplied to gates of the first pMOS transistor 1711 and the first nMOS transistor 1721. A data signal (IN) 1732 is inverted by the second inverter circuit 1702 to be supplied to a gate of the second nMOS transistor 1722. A drain of the first pMOS transistor 1711 and a source of the second nMOS transistor 1722 are connected to a node N. A drain of the second nMOS transistor 1722 and a source of the first nMOS transistor 1721 are connected to each other. A drain of the first nMOS transistor 1721 is connected to ground. A drain and a gate of the second pMOS transistor 1712 are connected to the node N and ground, respectively.

The first conventional dynamic driving circuit of FIG. 1 is operable as shown in FIG. 2. In FIG. 2, a precharge period is a period in which the clock signal (CLK) 1731 has a high level. An evaluation (or sampling) period is another period in which the clock signal (CLK) 1731 has a low level.

When the clock signal (CLK) 1731 has a low level (that is, the driving circuit is put in the evaluation period) and the data signal (IN) 1732 has a high level, the first pMOS transistor 1711 and the second nMOS transistor 1722 are turned off. In this event, if the second pMOS transistor 1712 is not present, an output signal (OUT) 1741 would act as a dynamic node in a high-impedance (High-Z) state. By provision of the second pMOS transistor 1712 with its gate connected to ground, the output signal (OUT) 1741 is raised to a high level and maintains the high level, as illustrated in FIG. 2.

Figure 3:
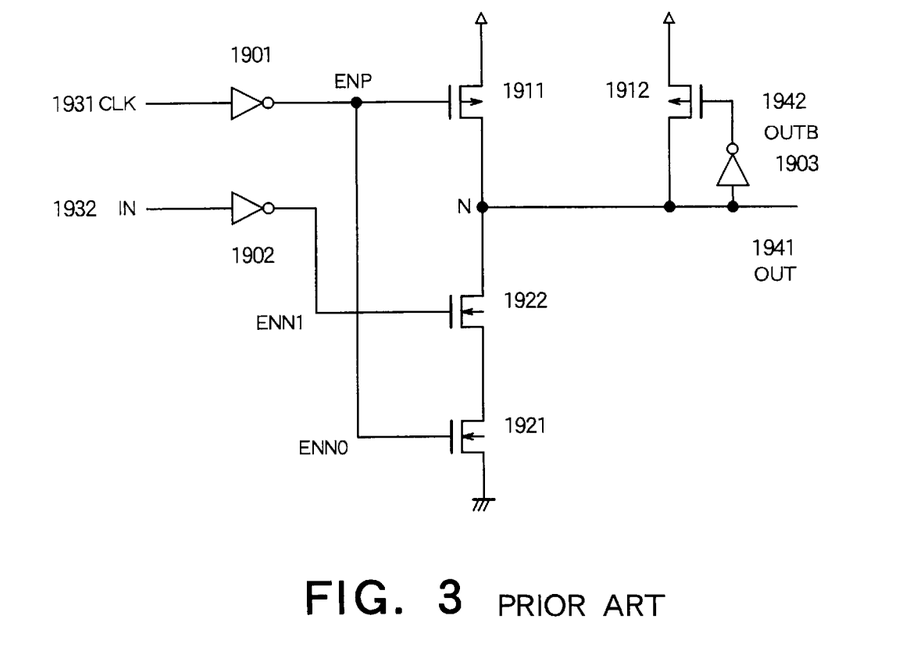
FIG. 3 is a circuit diagram of a second conventional dynamic driving circuit.
Figure 4:
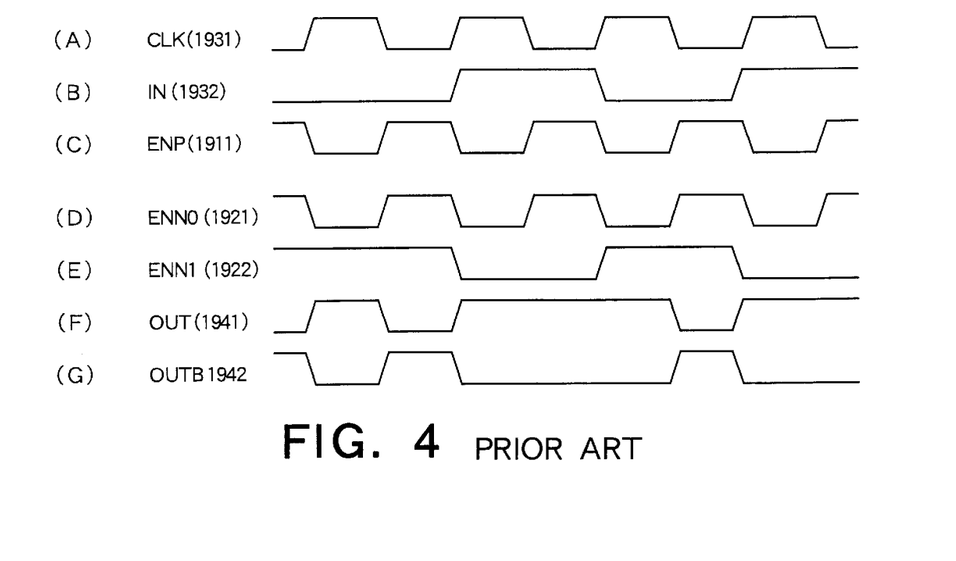
FIG. 4 shows waveforms of various signals in the circuit illustrated in FIG. 3.

Referring to FIGS. 3 and 4, the second conventional dynamic driving circuit will be described.

As illustrated in FIG. 3, the second conventional dynamic driving circuit comprises first through third inverter circuits 1901, 1902, and 1903, first and second pMOS transistors 1911 and 1912, and first and second nMOS transistors 1921 and 1922. A clock signal (CLK) 1931 is inverted by the first inverter circuit 1901 to be supplied to gates of the first pMOS transistor 1911 and the first nMOS transistor 1921. A data signal (IN) 1932 is inverted by the second inverter circuit 1902 to be supplied to a gate of the second nMOS transistor 1922. A drain of the first pMOS transistor 1911 and a source of the second nMOS transistor 1922 are connected to a node N. A drain of the second nMOS transistor 1922 and a source of the first nMOS transistor 1921 are connected to each other. A drain of the first nMOS transistor 1921 is connected to ground. A drain of the second pMOS transistor 1912 is connected to the node N. An output signal (OUT) 1941 is inverted by the third inverter circuit 1903 into an inverted output signal (OUTB) 1942 to be supplied to a gate of the second pMOS transistor 1912.

In the second conventional dynamic driving circuit, the inverted output signal (OUTB) 1942 of the output signal (OUT) 1941 is connected to the gate of the second pMOS transistor 1912 so that, when the clock signal (CLK) 1931 has a low level (that is, the driving circuit is put in the evaluation period) and the data signal (IN) 1932 has a high level, the output signal (OUT) 1941 maintains a high level, as illustrated in FIG. 4.

Each of the above-mentioned first and the second dynamic driving circuits is provided with a charging arrangement (1712 or 1912) for supplying electric charges to a signal line even during the evaluation period (namely, when the clock signal (CLK) 1731 or 1931 has a low level). Thus, a charge level is maintained so as to enhance an immunity against noise and to reduce the possibility of malfunction.

Besides the first and the second conventional driving circuits mentioned above, proposal is made of several kinds of dynamic driving circuits which will presently be described.

Japanese Unexamined Patent Publication (JP-A) No. 63-195898 (195898/1988) discloses an integrated circuit comprising a signal line provided with a precharging arrangement and a positive feedback circuit operated during a discharge period of the signal line to amplify a signal to be transmitted to the signal line. In this integrated circuit, a discharge operation of the signal line to be discharged is promoted to thereby increase a signal transmission rate.

Japanese Unexamined Patent Publication (JP-A) No. 1-161913 (161913/1989) discloses a clock driving circuit comprising a first MOS switch inserted between a first potential and a clock signal output terminal and controllably turned on and off in response to an input clock signal, a second MOS switch inserted between a second potential and the clock signal output terminal and controllably turned on and off in response to the input clock signal, and a constant current supply circuit inserted between the first MOS switch and the first potential. In this clock driving circuit, it is possible to obtain an output clock signal having a constant rise rate and a constant fall rate.

Japanese Unexamined Patent Publication (JP-A) No. 1-175412 (175412/1989) discloses an integrated circuit comprising a plurality of logical operator blocks each of which is supplied with an input signal through an input signal line and executes a predetermined logical operation to produce a logical operation result as an output signal to be transmitted through an output signal line to an output side in response to a clock signal. Each logical operator block has a spare level setting unit for setting a level of at least one of the input and the output signal lines to a predetermined spare level. In this integrated circuit, it is possible to reduce a load capacitance so that an integration density is increased and to reduce a line resistance so that a response speed of a logical operator is increased.

Japanese Unexamined Patent Publication (JP-A) No. 2-124629 (124619/1990) discloses a bus driving circuit comprising three nMOSFETs and one pMOSFET. The bus driving circuit can perform a high-speed operation and is therefore applicable to a high-speed CMOS (complementary metal oxide semiconductor) integrated circuit.

However, the above-mentioned dynamic driving circuits have in the following disadvantages.

At first, a feedthrough current from a power supply to ground is caused to flow. When the feedthrough current flows, power consumption is increased and device deterioration due to EM (electro-migration) occurs. The feedthrough current is produced because, even during the transition to a low level, the signal line is supplied with electric charges through the charging arrangement so that a path from the power supply to ground (GND) is formed.

Second, a delay is increased. This is because, even during the transition to a low level, the signal line is supplied with electric charges through the charging arrangement so that the transition of the signal line is prevented.

Third, a circuit design is more complicated. This is because the charging arrangement must be inserted to the signal line at a required position.

SUMMARY OF THE INVENTION

It is an object of this invention to provide a noise-immune dynamic driving circuit which is capable of suppressing a feedthrough current and a delay with a simple circuit design.

Dynamic driving circuits according to this invention are as follows:

(1) A dynamic driving circuit supplied with a clock signal having high and low levels determining a precharge period and an evaluation period, respectively, and supplied with a data signal, the dynamic driving circuit comprising:
  a control unit supplied with the clock signal and the data signal for producing a control signal; and
  a signal line driving unit for producing, in response to the control signal received from the control unit, an output signal which drives a signal line;
  the control unit producing the control signal so that the output signal of the signal line driving unit has a high level in the precharge period irrespective of the data signal and that the output signal of the signal line driving unit has the high level only when the data signal has a high level in the evaluation period.

(2) A dynamic driving circuit as mentioned in (1), wherein the control unit producing the control signal so that the output signal of the signal line driving unit does not have the high level when the data signal has a low level in the evaluation period.

(3) A dynamic driving circuit supplied with a clock signal having high and low levels determining a precharge period and an evaluation period, respectively, and supplied with a data signal and an enable signal, the dynamic driving circuit comprising:
  a control unit supplied with the clock signal, the data signal, and the enable signal for producing a control signal; and
  a signal line driving unit for producing, in response to the control signal received from the control unit, an output signal which drives a signal line;
  the control unit producing the control signal so that the output signal of the signal line driving unit has a high level in the precharge period irrespective of the data signal and the enable signal and that the output signal of the signal line driving unit has the high level only when both the data signal and the enable signal have a high level in the evaluation period.

(4) A dynamic driving circuit as mentioned in (3), wherein the control unit producing the control signal so that the output signal of the signal line driving unit does not have the high level when the data signal has a low level in the evaluation period with the enable signal having the high level.

(5) A dynamic driving circuit supplied with a clock signal having high and low levels determining a predischarge period and an evaluation period, respectively, and supplied with a data signal, the dynamic driving circuit comprising:
  a control unit supplied with the clock signal and the data signal for producing a control signal; and
  a signal line driving unit for producing, in response to the control signal received from the control unit, an output signal which drives a signal line;
  the control unit producing the control signal so that the output signal of the signal line driving unit has a low level in the predischarge period irrespective of the data signal and that the output signal of the signal line driving unit has the low level only when the data signal has a low level in the evaluation period.

(6) A dynamic driving circuit as mentioned in (5), wherein the control unit producing the control signal so that the output signal of the signal line driving unit does not have the low level when the data signal has a high level in the evaluation period.

(7) A dynamic driving circuit supplied with a clock signal having high and low levels determining a predischarge period and an evaluation period, respectively, and supplied with a data signal and an enable signal, the dynamic driving circuit comprising:
  a control unit supplied with the clock signal, the data signal, and the enable signal for producing a control signal; and
  a signal line driving unit for producing, in response to the control signal received from the control unit, an output signal which drives a signal line;
  the control unit producing the control signal so that the output signal of the signal line driving unit has a low level in the predischarge period irrespective of the data signal and the enable signal and that the output signal of the signal line driving unit has the low level only when the data signal has a low level in the evaluation period with the enable signal having a high level.

(8) A dynamic driving circuit as mentioned in (7), wherein the control unit producing the control signal so that the output signal of the signal line driving unit does not have the low level when the data signal has a high level in the evaluation period with the enable signal having the high level.

(9) A dynamic driving circuit supplied with a clock signal having high and low levels determining a precharge period and an evaluation period, respectively, and supplied with a data signal, the dynamic driving circuit comprising:
  a control unit supplied with the clock signal and the data signal for producing a high-level control signal and a low-level control signal;

a high-level driving unit for producing, in response to the high-level control signal received from the control unit, an output signal which drives a signal line into a high level; and a low-level driving unit for producing, in response to the low-level control signal received from the control unit, another output signal which drives the signal line into a low level;

the control unit producing the high-level control signal so that the output signal of the high-level driving unit has a high level in the precharge period irrespective of the data signal and that the output signal of the highlevel driving unit has the high level only when the data signal has a high level in the evaluation period;

the control unit producing the low-level control signal so that the output signal of the low-level driving unit has a low level only when the data signal has a low level in the evaluation period.

(10) A dynamic driving circuit supplied with a clock signal having high and low levels determining a precharge period and an evaluation period, respectively, and supplied with a data signal and an enable signal, the dynamic driving circuit comprising:

a control unit supplied with the clock signal, the data signal, and the enable signal for producing a high-level control signal and a low-level control signal;

a high-level driving unit for producing, in response to the high-level control signal received from the control unit, an output signal which drives a signal line into a high level; and a low-level driving unit for producing, in response to the low-level control signal received from the control unit, another output signal which drives the signal line into a low level;

the control unit producing the high-level control signal so that the output signal of the high-level driving unit has a high level in the precharge period irrespective of the data signal and the enable signal and that the output signal of the high-level driving unit has the high level only when both the data signal and the enable signal have a high level in the evaluation period;

the control unit producing the low-level control signal so that the output signal of the low-level driving unit has a low level only when the data signal has a low level in the evaluation period with the enable signal having the high level.

(11) A dynamic driving circuit as mentioned in (10), wherein the control unit produces, when the enable signal has a low level, none of the high-level control signal and the low-level control signal so that both of the high-level driving unit and the low-level driving unit are turned off irrespective of the level of the data signal.

DESCRIPTION OF THE PREFERRED EMBODIMENTS

Now, description will be made about embodiments of this invention with reference to the drawing.

Figure 5:
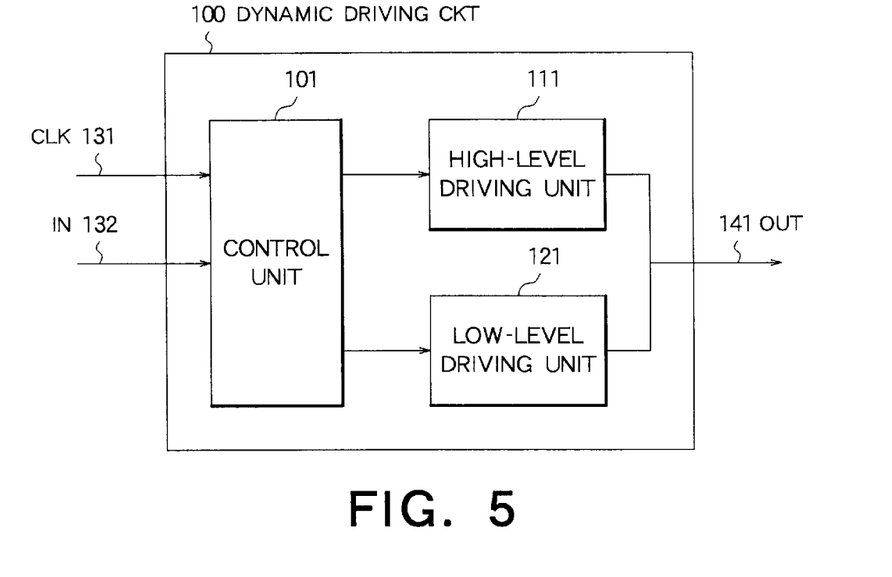
FIG. 5 is a block diagram of a dynamic driving circuit according to a first embodiment of this invention.

Referring to FIG. 5, a dynamic driving circuit 100 according to a first embodiment of this invention comprises a control unit 101 supplied with a clock signal (CLK) 131 and a data signal (IN) 132, and high-level and low-level driving units 111 and 112 controlled by the control unit 101 in response to the clock and the data signals 131 and 132 supplied to the control unit 101.

The dynamic driving circuit 100 is operated in the following manner.

During a precharge period, the control unit 101 activates the high-level driving unit 111 irrespective of whether the data signal (IN) 132 has a high level or a low level. The high-level driving unit 111 charges an output signal (OUT) 141 to make the output signal 141 have a high level.

When the precharge period lapses and an evaluation period is started, the control unit 101 activates the low-level driving unit 121 when the data signal (IN) 132 has a low level. The low-level driving unit 121 discharges the output signal (OUT) 141 to make the output signal 141 have a low level. On the other hand, when the data signal (IN) 132 has a high level, the control unit 101 activates the high-level driving unit 111 to maintain the output signal (OUT) 141 at a high level.

Figure 6:
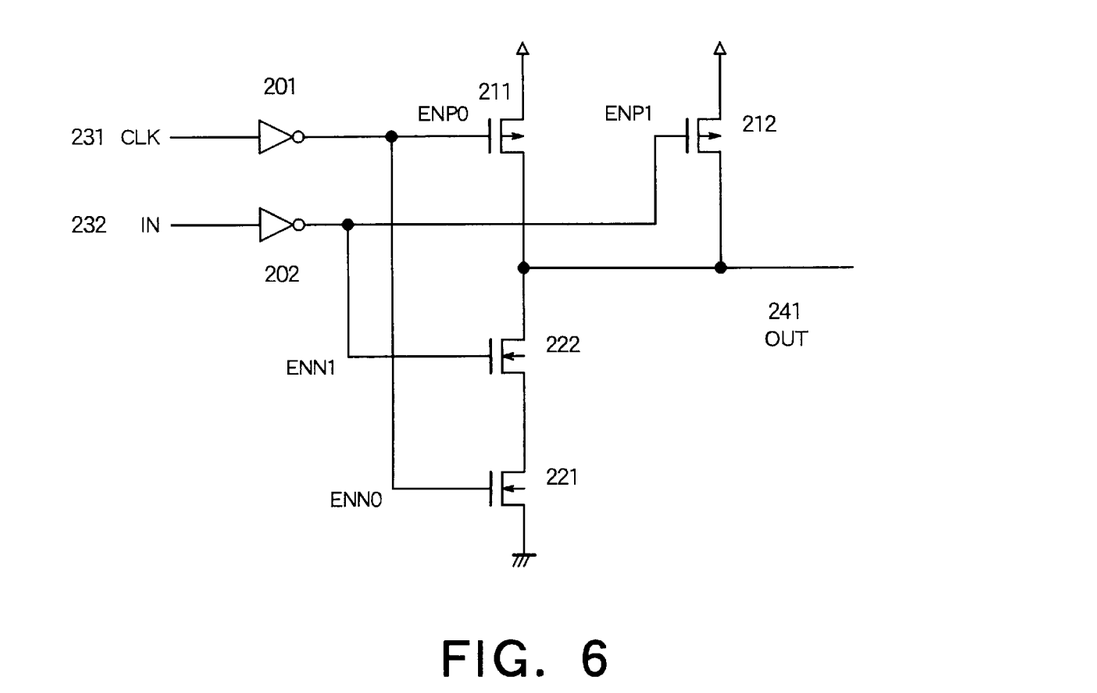
FIG. 6 shows a first circuit structure of the dynamic driving circuit illustrated in FIG. 5.

Referring to FIG. 6, the dynamic driving circuit 100 in FIG. 5 can be implemented by a first circuit structure illustrated in the figure. Specifically, a high level is driven by first and second pMOS transistors 211 and 212 while a low level is driven by first and second nMOS transistors 221 and 222. The first pMOS transistor 211 and the first nMOS transistor 221 are controlled by an output of a first inverter circuit 201 supplied with a clock signal (CLK) 231. The second pMOS transistor 212 and the second nMOS transistor 222 are controlled by an output of a second inverter circuit 202 supplied with a data signal (IN) 232.

Figure 7:
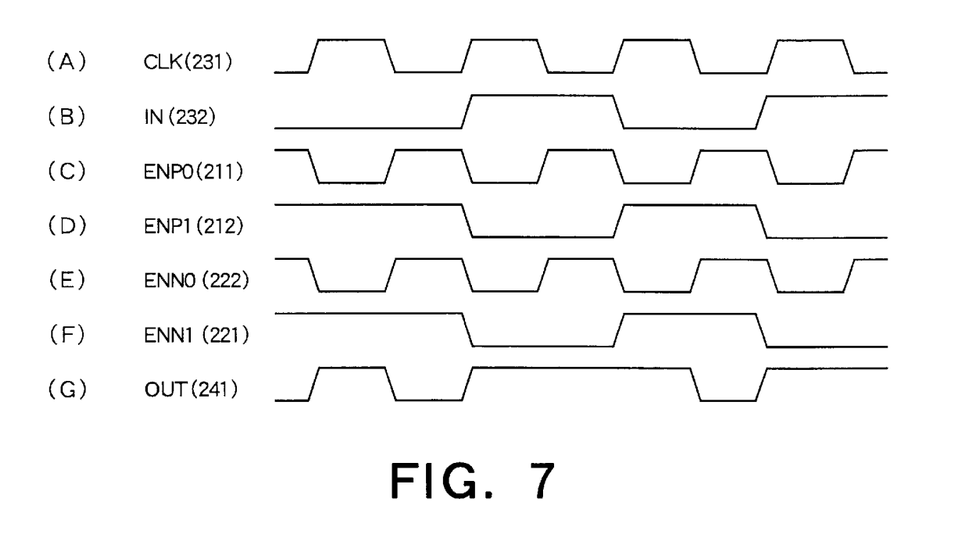
FIG. 7 shows waveforms of various signals in the circuit illustrated in FIG. 6.

Next referring to FIG. 7, a circuit operation of the dynamic driving circuit 100 of the first circuit structure will be described. The clock signal (CLK) 231, the data signal (IN) 232, input signals (ENP0 and ENP1) supplied to the first and the second pMOS transistors 211 and 212, input signals (ENN0 and ENN1) supplied to the first and the second nMOS transistors 221 and 222, and a data output signal (OUT) 241 have waveforms illustrated in FIG. 7.

The precharge period is a period in which the clock signal (CLK) 231 has a high level. During the precharge period, the first pMOS transistor 211 is turned on and the data output signal (OUT) 241 is given a high level.

The evaluation period is a period in which the clock signal (CLK) 231 has a low level. In accordance with the level of the data signal (IN) 232, the level of the data output signal (OUT) 241 is determined. Specifically, when the data signal (IN) 232 has a low level, the second nMOS transistor 222 is turned on and the data output signal (OUT) 241 has a low level. On the other hand, when the data signal (IN) 232 has a high level, the second pMOS transistor 212 is turned on and the data output signal (OUT) 241 maintains a high level.

The second pMOS transistor 212 serves to maintain the level of the data output signal (OUT) 241 and, therefore, can be smaller in size than the first pMOS transistor 211 for precharge.

Figure 8:
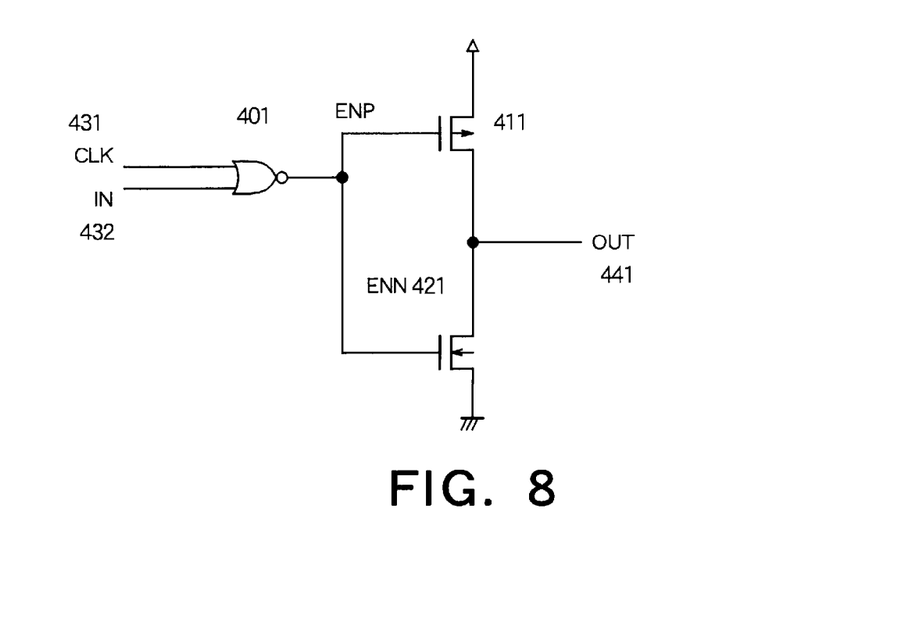
FIG. 8 shows a second circuit structure of the dynamic driving circuit illustrated in FIG. 5.

Referring to FIG. 8, the dynamic driving circuit 100 in FIG. 5 can be implemented by a second circuit structure illustrated in the figure. Specifically, a high level is driven by a pMOS transistor 411 while a low level is driven by an nMOS transistor 421. The pMOS transistor 411 and the nMOS transistor 421 are controlled by a NOR circuit 401 supplied with a clock signal (CLK) 431 and a data signal (IN) 432. The second circuit structure is simple compared with the first circuit structure described above.

Next referring to FIG. 9, a circuit operation of the dynamic driving circuit 100 of the second circuit structure will be described. The clock signal (CLK) 431, the data signal (IN) 432, an input signal (ENP) to the pMOS transistor 411, an input signal (ENN) to the nMOS transistor 421, and a data output signal (OUT) 441 have waveforms illustrated in FIG. 9.

Figure 9:
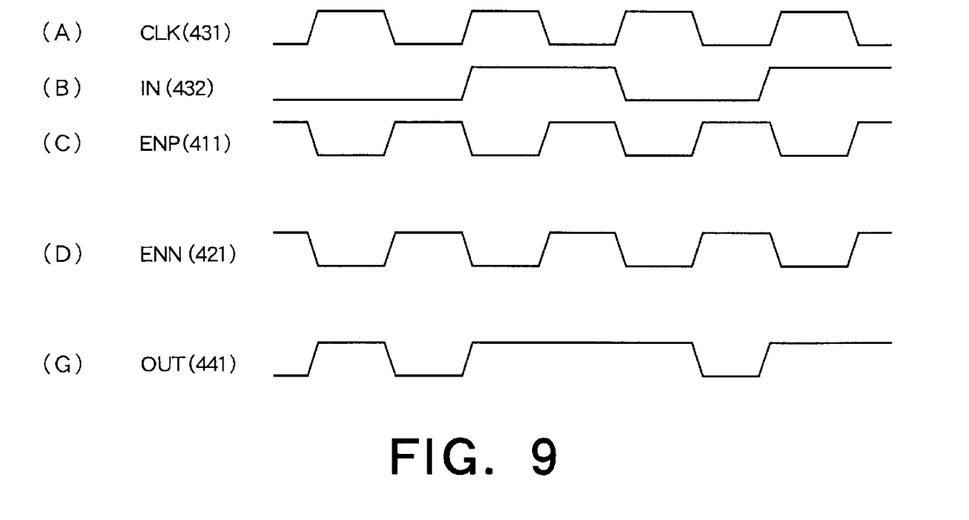
FIG. 9 shows waveforms of various signals in the circuit illustrated in FIG. 8.

As illustrated in FIG. 9, when the clock signal (CLK) 431 has a high level, an output of the NOR circuit 401 has a low level. The pMOS transistor 411 is turned on and the data output signal (OUT) 441 is given a high level.

When the clock signal (CLK) 431 has a low level, the level of the data output signal (OUT) 441 is determined in accordance with the level of the data signal (IN) 432. Specifically, when the data signal (IN) 432 has a high level, the pMOS transistor 411 is turned on and the data output signal (OUT) 441 maintains a high level. When the data signal (IN) 432 has a low level, the output of the NOR circuit 401 has a high level. The pMOS transistor 411 is turned off while the nMOS transistor 421 is turned on. In this event, the data output signal (OUT) 441 has a low level.

Figure 10:
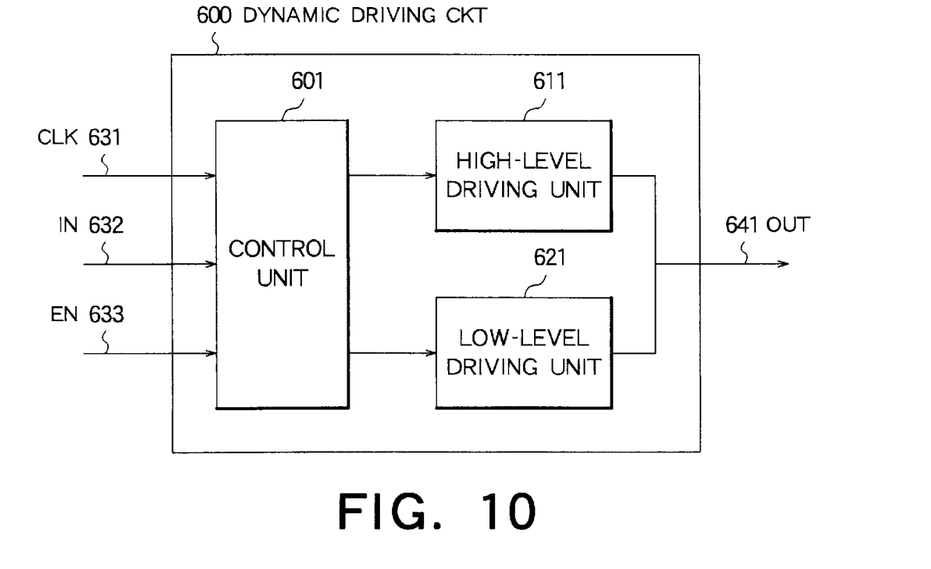
FIG. 10 is a block diagram of a dynamic driving circuit according to a second embodiment of this invention.

Referring to FIG. 10, a dynamic driving circuit 600 according to a second embodiment of this invention comprises a control unit 601 supplied with a clock signal (CLK) 631, a data signal (IN) 632, and an enable signal or an output enable signal (EN) 633, and high-level and low-level driving units 611 and 621 controlled by the control unit 601 in response to the clock, the data, and the enable signals 631, 632, and 633.

The dynamic driving circuit 600 is operated in the following manner.

During a precharge period, the control unit 601 activates the high-level driving unit 611 irrespective of whether the data signal (IN) 632 has a high level or a low level. The high-level driving unit 611 charges an output signal (OUT) 641 to make the output signal (OUT) 641 have a high level.

When the precharge period lapses and an evaluation period is started, the control unit 601 activates the low-level driving unit 621 when the enable signal (EN) 633 has a high level and the data signal (IN) 632 has a low level. On the other hand, when the data signal (IN) 632 has a high level, the control unit 601 activates the high-level driving unit 611.

When the enable signal (EN) 633 has a low level, the control unit 601 turns off both the high-level and the low-level driving units 611 and 621.

The dynamic driving circuit 600 of the second embodiment is used as a bus driving circuit.

Figure 11:
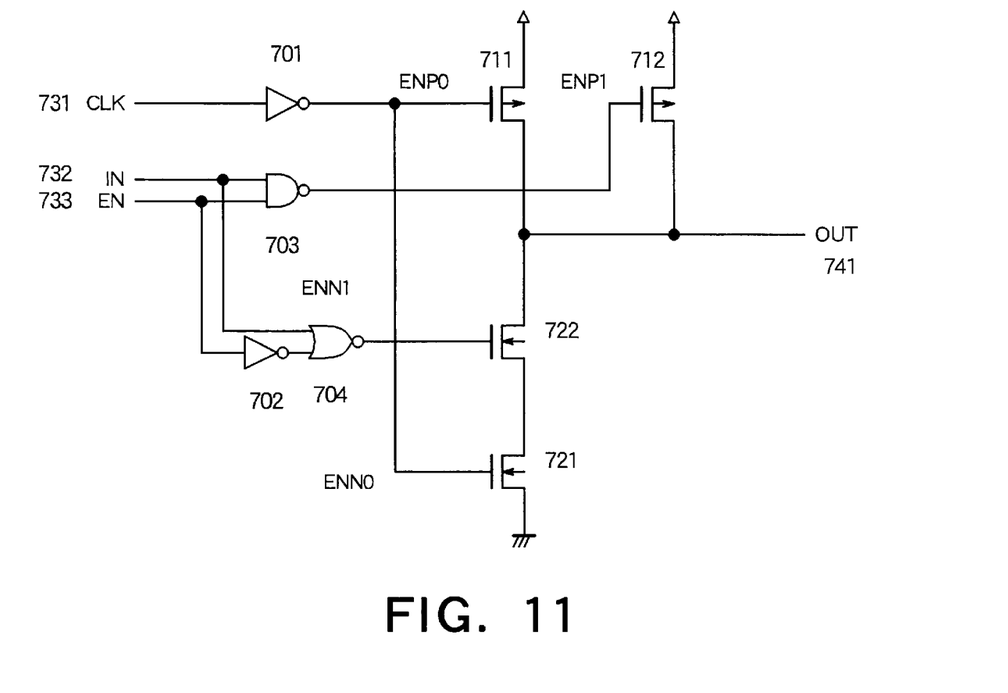
FIG. 11 is a first circuit structure of the dynamic driving circuit illustrated in FIG. 10.

Referring to FIG. 11, the dynamic driving circuit 600 in FIG. 10 can be implemented by a first circuit structure illustrated in the figure. Specifically, a high level is driven by first and second pMOS transistors 711 and 712 while a low level is driven by first and second nMOS transistors 721 and 722. The first pMOS transistor 711 and the first nMOS transistor 721 are controlled by a first inverter circuit 701 supplied with a clock signal (CLK) 731. The second pMOS transistor 712 is controlled by a NAND circuit 703 supplied with a data signal (IN) 732 and an enable signal or an output enable signal (EN) 733. The second nMOS transistor 722 is controlled by a NOR circuit 704 supplied with the data signal (IN) 732 and an inverted enable signal obtained by inverting the enable signal (EN) 733 by a second inverter circuit 702.

Figure 12:
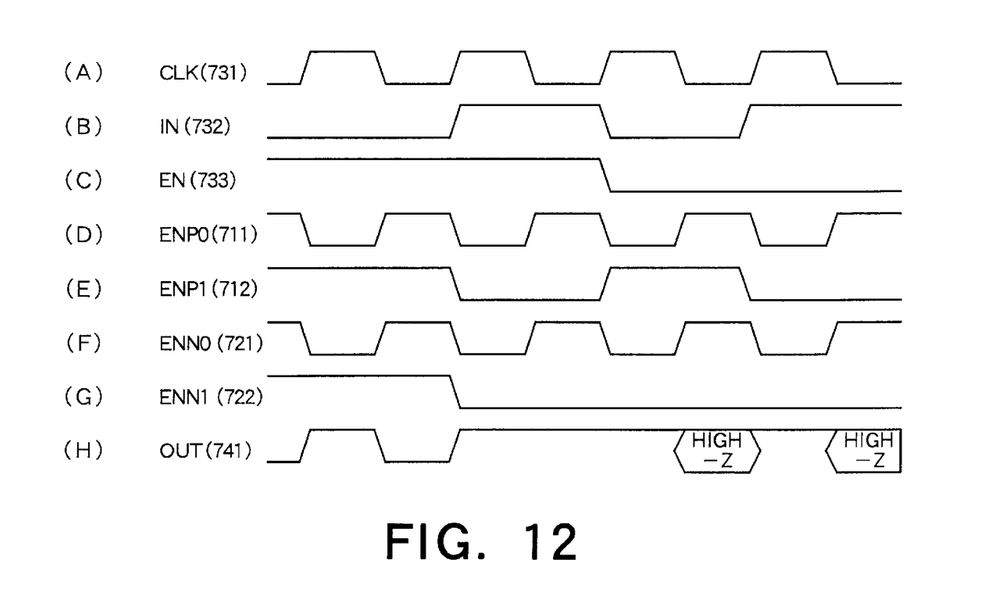
FIG. 12 shows waveforms of various signals in the circuit illustrated in FIG. 11.

Next referring to FIG. 12, a circuit operation of the dynamic driving circuit 600 of the first circuit structure will be described. The clock signal (CLK) 731, the data signal (IN) 732, the enable signal (EN) 733, input signals (ENP0 and ENP1) supplied to the first and the second pMOS transistors 711 and 712, input signals (ENN0 and ENN1) supplied to the first and the second nMOS transistors 721 and 722, and a data output signal (OUT) 741 have waveforms illustrated in FIG. 12.

The precharge period is a period in which the clock signal (CLK) 731 has a high level. During the precharge period, the first pMOS transistor 711 is turned on and the data output signal (OUT) 741 is given a high level.

The evaluation period is a period in which the clock signal (CLK) 731 has a low level. In accordance with the level of the data signal (IN) 732, the level of the data output signal (OUT) 741 is determined. Specifically, when the enable signal (EN) 733 has a high level and the data signal (IN) 732 has a high level, the second pMOS transistor 712 is turned on and the data output signal (OUT) 741 maintains a high level. The second pMOS transistor 712 serves to maintain the level of the data output signal (OUT) 741 and, therefore, can be smaller in size than the first pMOS transistor 711 for precharge.

When the enable signal (EN) 733 has a low level, the data output signal (OUT) 741 is put into a high-impedance (High-Z) state during the evaluation period.

Figure 13:
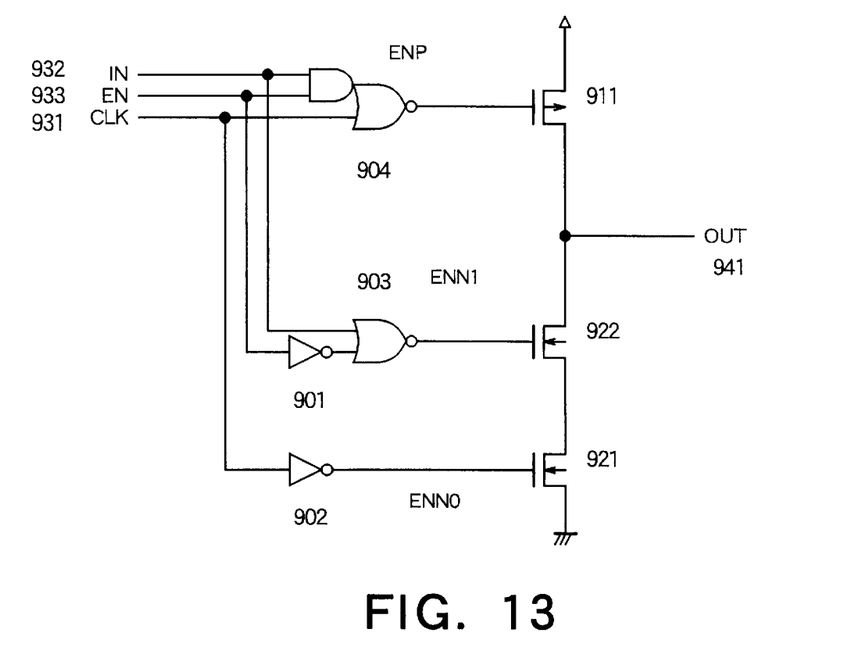
FIG. 13 is a second circuit structure of the dynamic driving circuit illustrated in FIG. 10.

Referring to FIG. 13, the dynamic driving circuit 600 in FIG. 10 can be implemented by a second circuit structure illustrated in the figure. Specifically, a high level is driven by a pMOS transistor 911 while a low level is driven by first and second nMOS transistors 921 and 922. The pMOS transistor 911 is controlled by an ANDNOR circuit 904 supplied with a clock signal (CLK) 931, a data signal (IN) 932, and an enable signal or an output enable signal (EN) 933. The first nMOS transistor 921 is controlled by an inverter circuit 902 supplied with the clock signal (CLK) 931. The second nMOS transistor 922 is controlled by a NOR circuit 903 supplied with the data signal (IN) 932 and an inverted enable signal obtained by inverting the enable signal (EN) 933 by the inverter circuit 901.

Figure 14:
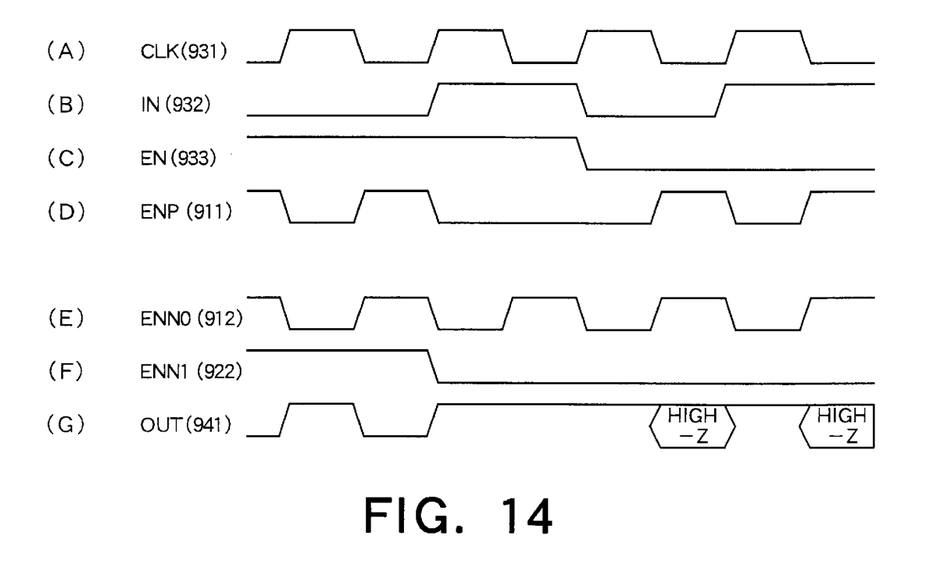
FIG. 14 shows waveforms of various signals in the circuit illustrated in FIG. 13.

Next referring to FIG. 14, a circuit operation of the dynamic driving circuit 600 of the second circuit structure will be described. The clock signal (CLK) 931, the data signal (IN) 932, the enable signal (EN) 933, an input signal (ENP) supplied to the pMOS transistor 911, input signals (ENN0 and ENN1) supplied to the first and the second nMOS transistors 921 and 922, and a data output signal (OUT) 941 have waveforms illustrated in FIG. 14.

The precharge period is a period in which the clock signal (CLK) 931 has a high level. During the precharge period, the pMOS transistor 911 is turned on and the data output signal (OUT) 941 is given a high level.

The evaluation period is a period in which the clock signal (CLK) 931 has a low level. During the evaluation period, the level of the data output signal (OUT) 941 is determined in accordance with the level of the data signal (IN) 932. Specifically, when the enable signal (EN) 933 has a high level and the data signal (IN) 932 has a high level, the pMOS transistor 911 is turned on and the data output signal (OUT) 941 maintains a high level.

When the enable signal (EN) 933 has a low level, the data output signal (OUT) 941 is put into a high-impedance (High-Z) state during the evaluation period. The high-impedance (High-Z) state is used as one state of a tri-state buffer.

Figure 15:
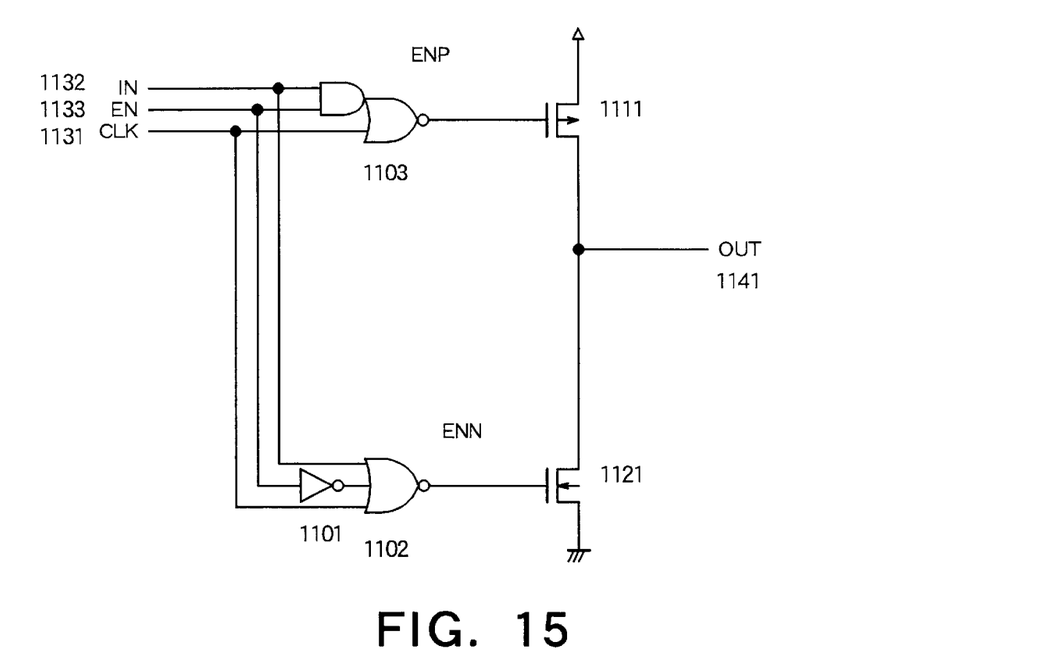
FIG. 15 is a third circuit structure of the dynamic driving circuit illustrated in FIG. 10.

Referring to FIG. 15, the dynamic driving circuit 600 in FIG. 10 can be implemented by a third circuit structure illustrated in the figure. Specifically, a high level is driven by a pMOS transistor 1111 while a low level is driven by an nMOS transistor 1121. The pMOS transistor 1111 is controlled by an ANDNOR circuit 1103 supplied with a clock signal (CLK) 1131, a data signal (IN) 1132, and an enable signal or an output enable signal (EN) 1133. The nMOS transistor 1121 is controlled by a NOR circuit 1102 supplied with the clock signal (CLK) 1131, the data signal (IN) 1132, and an inverted enable signal obtained by inverting the enable signal (EN) 1133 by the inverter circuit 1101.

Figure 16:
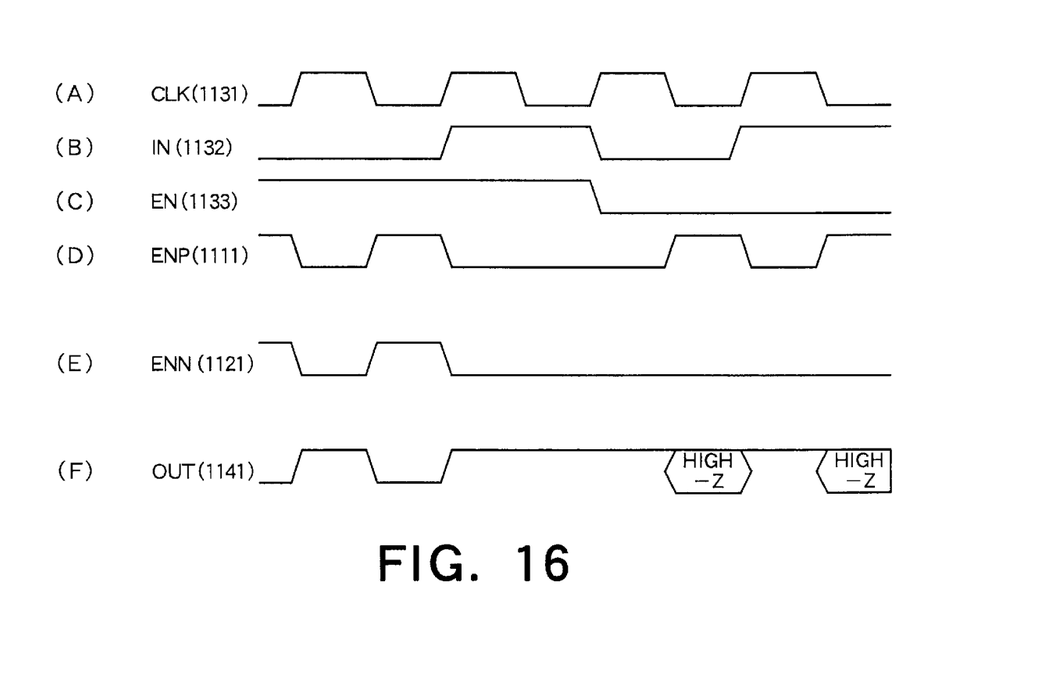
FIG. 16 shows waveforms of various signals in the circuit illustrated in FIG. 15.

Next referring to FIG. 16, a circuit operation of the dynamic driving circuit 600 of the third circuit structure will be described. The clock signal (CLK) 1131, the data signal (IN) 1132, the enable signal (EN) 1133, an input signal (ENP) supplied to the pMOS transistor 1111, an input signal (ENN) supplied to the nMOS transistor 1121, and a data output signal (OUT) 1141 have waveforms illustrated in FIG. 16.

The precharge period is a period in which the clock signal (CLK) 1131 has a high level. During the precharge period, the pMOS transistor 1111 is turned on and the data output signal (OUT) 1141 is given a high level.

The evaluation period is a period in which the clock signal (CLK) 1131 has a low level. In accordance with the level of the data signal (IN) 1132, the level of the data output signal (OUT) 1141 is determined. Specifically, when the enable signal (EN) 1133 has a high level and the data signal (IN) 1132 has a high level, the pMOS transistor 1111 is turned on so that the data output signal (OUT) 1141 maintains a high level.

When the enable signal (EN) 1133 has a low level, the data output signal (OUT) 1141 is put into a high-impedance (High-Z) state during the evaluation period.

Figure 17:
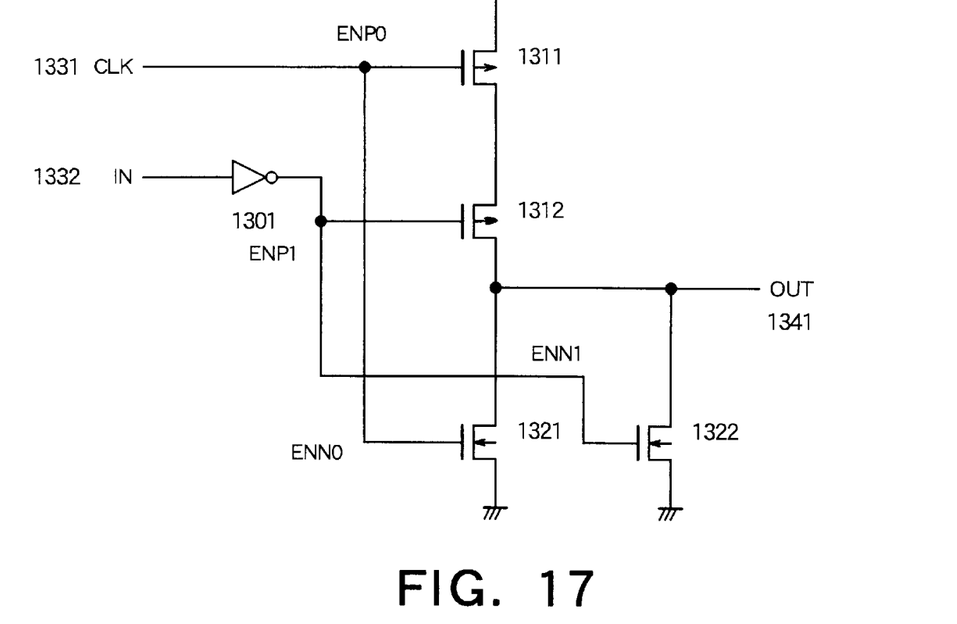
FIG. 17 is a fourth circuit structure of the dynamic driving circuit illustrated in FIG. 10.

Referring to FIG. 17, the dynamic driving circuit 600 in FIG. 10 can be implemented by a fourth circuit structure illustrated in the figure. Specifically, a high level is driven by first and second pMOS transistors 1311 and 1312 while a low level is driven by first and second nMOS transistors 1321 and 1322. The first pMOS transistor 1311 and the first nMOS transistor 1321 are controlled by a clock signal (CLK) 1331. The second pMOS transistor 1312 and the second nMOS transistor 1322 are controlled by an inverter circuit 1301 supplied with a data signal (IN) 1332.

Figure 18:
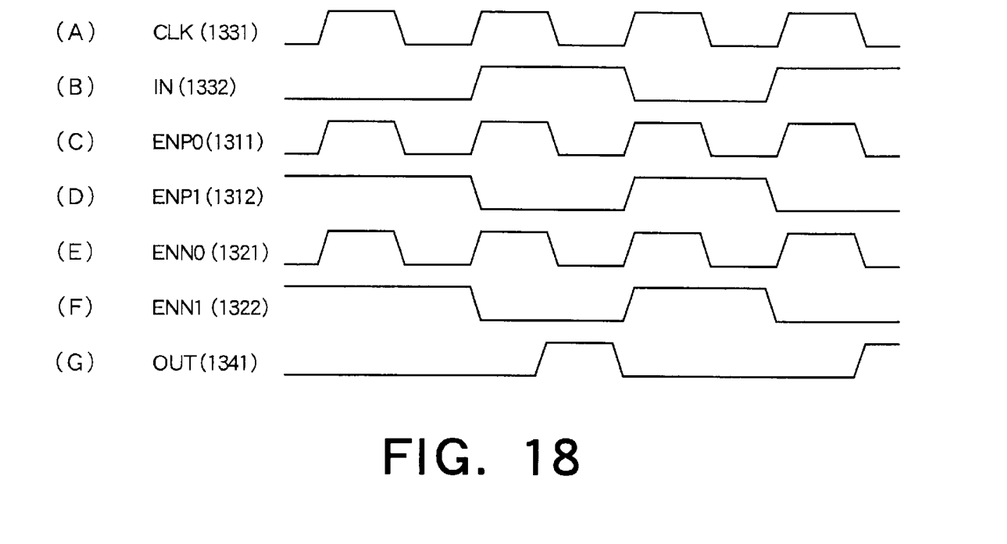
FIG. 18 shows waveforms of various signals in the circuit illustrated in FIG. 17.

Next referring to FIG. 18, a circuit operation of the dynamic driving circuit 600 of the fourth circuit structure will be described. The clock signal (CLK) 1331, the data signal (IN) 1332, input signals (ENP0 and ENP1) supplied to the first and the second pMOS transistors 1311 and 1312, input signals (ENN0 and ENN1) supplied to the first and the second nMOS transistors 1321 and 1322, and a data output signal (OUT) 1341 have waveforms illustrated in FIG. 7.

The predischarge period is a period in which the clock signal (CLK) 1331 has a high level. During the predischarge period, the first nMOS transistor 1321 is turned on and the data output signal (OUT) 1341 is given a low level.

The evaluation period is a period in which the clock signal (CLK) 1331 has a low level. In accordance with the level of the data signal (IN) 1332, the level of the data output signal (OUT) 1341 is determined. Specifically, when the data signal (IN) 1332 has a high level, both the first and the second pMOS transistors 1311 and 1312 are turned on and the data output signal (OUT) 1341 is given a high level.

When the data signal (IN) 1332 has a low level, the second nMOS transistor 1322 is turned on and the data output signal (OUT) 1341 maintains a low level. The second nMOS transistor 1322 serves to maintain the level of the data output signal (OUT) 1341 and, therefore, can be smaller in size than the first pMOS transistor 1321 for predischarge.

Figure 19:
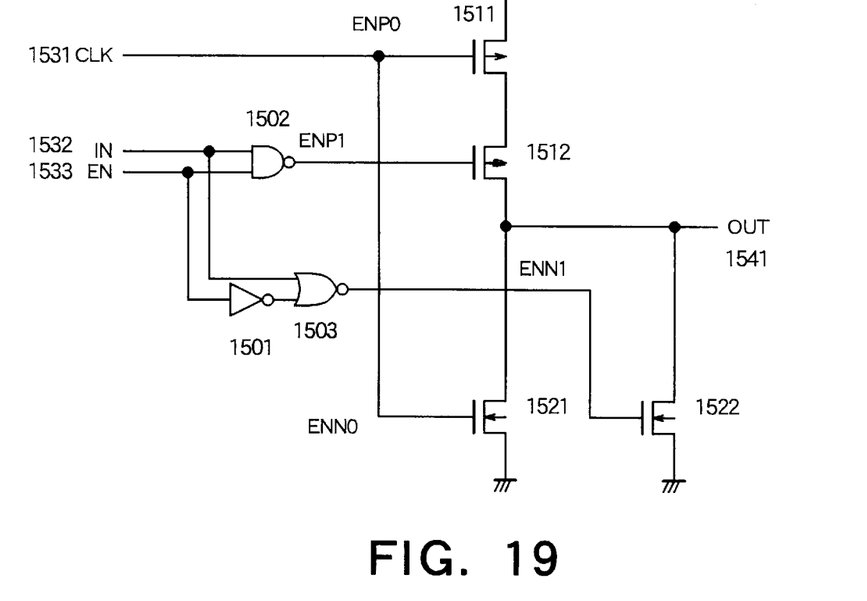
FIG. 19 is a fifth circuit structure of the dynamic driving circuit illustrated in FIG. 10.

Referring to FIG. 19, the dynamic driving circuit 600 in FIG. 10 can be implemented by a fifth circuit structure illustrated in the figure. Specifically, a high level is driven by first and second pMOS transistors 1511 and 1512 while a low level is driven by first and second nMOS transistors 1521 and 1522. The first pMOS transistor 1511 and the first nMOS transistor 1521 are controlled by a clock signal (CLK) 1531. The second pMOS transistor 1512 is controlled by a NAND circuit 1502 supplied with a data signal (IN) 1532 and an enable signal (EN) 1533. The second nMOS transistor 1522 is controlled by a NOR circuit 1503 supplied with the data signal (IN) 1532 and an inverted enable signal obtained by inverting the enable signal (EN) 1533 by an inverter circuit 1501.

Figure 20:
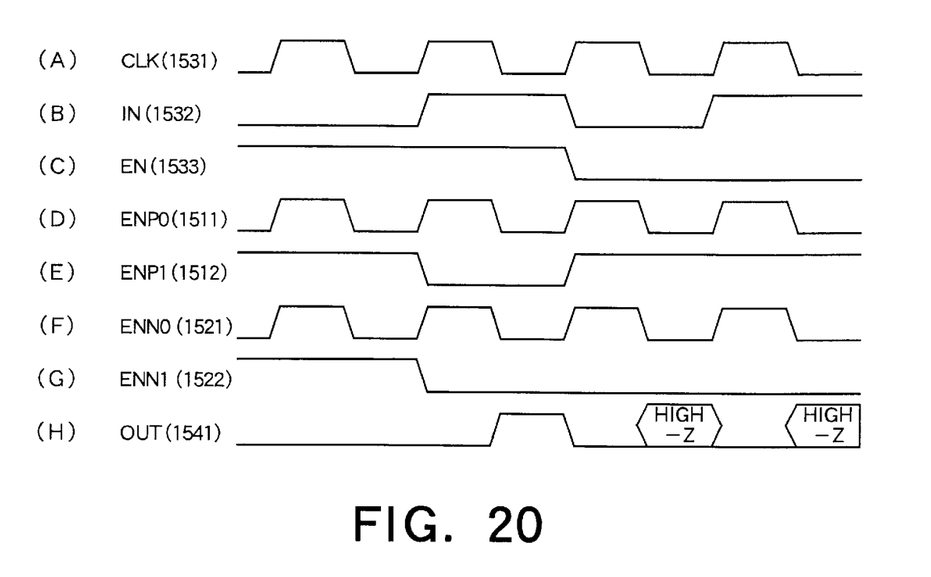
FIG. 20 shows waveforms of various signals in the circuit illustrated in FIG. 19.

Next referring to FIG. 20, a circuit operation of the dynamic driving circuit 600 of the fifth circuit structure will be described. The clock signal (CLK) 1531, the data signal (IN) 1532, the enable signal (EN) 1533, input signals (ENP0 and ENP1) supplied to the first and the second pMOS transistors 1511 and 1512, input signals (ENN0 and ENN1) supplied to the first and the second nMOS transistors 1521 and 1522, and a data output signal (OUT) 1541 have waveforms illustrated in FIG. 20.

The predischarge period is a period in which the clock signal (CLK) 1531 has a high level. During the predischarge period, the first nMOS transistor 1521 is turned on and the data output signal (OUT) 1541 is given a low level.

The evaluation period is a period in which the clock signal (CLK) 1531 has a low level. In accordance with the level of the data signal (IN) 1532, the level of the data output signal (OUT) 1541 is determined. Specifically, when the enable signal (EN) 1533 has a high level and the data signal (IN) 1532 has a low level, the second nMOS transistor 1522 is turned on and the data output signal (OUT) 1541 maintains a low level. The second nMOS transistor 1522 serves to maintain the level of the data output signal (OUT) 1541 and, therefore, can be smaller in size than the first nMOS transistor 1521 for predischarge.

When the enable signal (EN) 1533 has a low level, the data output signal (OUT) 1541 is put into a high-impedance (High-Z) state during the evaluation period.

The dynamic control circuits described above are advantageous in the following respects.

First, it is possible to suppress generation of a feedthrough current. In the dynamic driving circuits according to this invention, the high-level and the low-level driving units are not simultaneously turned on. Therefore, it is possible to prevent a feedthrough current path from being formed from a power supply to ground. As a result, no feedthrough current flows.

Second, it is possible to suppress the increase of a delay. In the dynamic driving circuits according to this invention, the high-level and the low-level driving units are not simultaneously turned on. Therefore, it is possible to activate the low-level driving unit without a leakage of electric charges from the charging arrangement.

Third, it is possible to reduce the complexity in circuit design. This is because the dynamic driving circuits of this invention do not require an additional charging arrangement for preventing malfunction.

What is claimed is:

1. A dynamic driving circuit supplied with a clock signal having logic high and logic low levels which determine a precharge period and an evaluation period, respectively, and supplied with a data signal, said dynamic driving circuit comprising:

a control unit supplied with said clock signal and said data signal and which produces a control signal in response thereto; and a signal line driver which produces, in response to said control signal received from said control unit, an output signal which drives a signal line, said signal line driver having a high level driver which causes said output signal to have said logic high level and a low level driver which causes said output signal to have said logic low level, said signal line driver actuating only one of said high level driver and said low level driver during said evaluation period;

wherein said control unit produces said control signal so that said output signal of said signal line driver has said logic high level in said precharge period regardless of the value of said data signal and that said output signal of said signal line driver has said logic high level in said evaluation period when said data signal has said logic high level in said evaluation period.

2. A dynamic driving circuit as claimed in claim 1, wherein said control unit produces said control signal so that, in said evaluation period, said output signal of said signal line driver does not have said logic high level when said data signal has said logic low level.

3. A dynamic driving circuit supplied with a clock signal having logic high and logic low levels determining a pre-charge period and an evaluation period, respectively, and supplied with a data signal and an enable signal, said dynamic driving circuit comprising:

a control unit supplied with said clock signal, said data signal, and said enable signal, and which produces a control signal in response thereto; and a signal line driver which produces, in response to said control signal received from said control unit, an output signal which drives a signal line, said signal line driver having a high level driver which causes said output signal to have said logic high level and a low level driver which causes said output signal to have said logic low level;

wherein said control unit produces said control signal so that said output signal of said signal line driver has said logic high level in said precharge period regardless of the value of said data signal and said enable signal and that said output signal of said signal line driver has said logic high level in said evaluation period when both said data signal and said enable signal have said logic high level in said evaluation period.

4. A dynamic driving circuit as claimed in claim 3, wherein said control unit produces said control signal so that, in said evaluation period, said output signal of said signal line driver does not have said logic high level when said data signal has said logic low level and said enable signal has said logic high level.

5. A dynamic driving circuit supplied with a clock signal having logic high and logic low levels which determine a predischarge period and an evaluation period, respectively, and supplied with a data signal, said dynamic driving circuit comprising:

a control unit supplied with said clock signal and said data signal, and which produces a control signal in response thereto; and a signal line driver which produces, in response to said control signal received form said control unit, an output signal which drives a signal line, said signal line driver having a high level driver which causes said output signal to have said logic high level and a low level driver which causes said output signal to have said logic low level;

wherein said control unit produces said control signal so that said output signal of said signal line driver has said logic low level in said predischarge period regardless of the value of said data signal and that said output signal of said signal line driver has said logic low level in said evaluation period when said data signal has said logic low level in said evaluation period.

6. A dynamic driving circuit as claimed in claim 5, wherein said control unit produces said control signal so that, in said evaluation period, said output signal of said signal line driver does not have said logic low level when said data signal has said logic high level.

7. A dynamic driving circuit supplied with a clock signal having logic high and logic low levels which determine a predischarge period and an evaluation period, respectively, and supplied with a data signal and an enable signal, said dynamic driving circuit comprising:

a control unit supplied with said clock signal, said data signal, and said enable signal, and which produces a control signal in response thereto; and a signal line driver which produces, in response to said control signal received from said control unit, an output signal which drives a signal line, said signal line driver having a high level driver which causes said output signal to have said logic high level and a low level driver which causes said output signal to have said logic low level;

wherein said control unit produces said control signal so that said output signal of said signal line driver has said logic low level in said predischarge period regardless of the value of said data signal and said enable signal and that said output signal of said signal line driver has said logic low level in said evaluation period when both said data signal has said logic low level and said enable signal has said logic high level in said evaluation period.

8. A dynamic driving circuit as claimed in claim 7, wherein said control unit produces said control signal so that, in said evaluation period, said output signal of said signal line driver does not have said logic low level when said data signal has said logic high level and said enable signal has said logic high level.

9. A dynamic driving circuit supplied with a clock signal having logic high and logic low levels which determine a precharge period and an evaluation period, respectively, and supplied with a data signal, said dynamic driving circuit comprising:

a control unit supplied with said clock signal and said data signal and which produces a high-level control signal and a low-level control signal in response thereto;

a high-level driver which produces, in response to said high-level control signal received from said control unit, a first output signal which drives a signal line into a logic high level; and a low-level driver which produces, in response to said low-level control signal received from said control unit, a second output signal which drives said signal line into a logic low level;

said control unit actuating only one of said high level driver and said low level driver during said evaluation period;

wherein said control unit produces said high-level control signal so that said first output signal of said high-level driver has said logic high level in said precharge period regardless of the value of said data signal and that said first output signal of said high-level driver has said logic high level in said evaluation period when said data signal has said logic high level in said evaluation period; and wherein said control unit produces said low-level control signal so that said output signal of said low-level driver has said logic low level in said evaluation period when said data signal has said logic low level in said evaluation period.

10. A dynamic driving circuit supplied with a clock signal having logic high and logic low levels determining a precharge period and an evaluation period, respectively, and supplied with a data signal and an enable signal, said dynamic driving circuit comprising:

a control unit supplied with said clock signal, said data signal, and said enable signal, and which produces a high-level control signal and a low-level control signal;

a high-level driver which produces, in response to said high level control signal received from said control unit, a first output signal which drives a signal line into a logic high level; and a low-level driver which produces, in response to said low-level control signal received from said control unit, a second output signal which drives said signal line into a logic low level;

wherein said control unit produces said high-level control signal so that said first output signal of said high-level driver has said logic high level in said precharge period regardless of the value of said data signal and said enable signal, and that said output signal of said high-level driver has said logic high level when both said data signal and said enable signal have said logic high level in said evaluation period; and wherein said control unit produces said low-level control signal so that said second output signal of said low-level driver has said logic low level in said evaluation period when, in said evaluation period, said data signal has said logic low level and said enable signal has said logic high level.

11. A dynamic driving circuit as claimed in claim 10, wherein said control unit produces, when the enable signal has said logic low level, none of said high-level control signal and said low-level control signal so that both of said logic high-level driver and said logic low-level driver are turned off regardless of the level of said data signal.

* * * * *